United States Patent [19]
Yokota

[11] Patent Number: 5,617,322
[45] Date of Patent: Apr. 1, 1997

[54] MESH GENERATOR AND GENERATING METHOD

[75] Inventor: Ikuhiro Yokota, Tokyo, Japan

[73] Assignee: NEC Corporation, Tokyo, Japan

[21] Appl. No.: 380,807

[22] Filed: Jan. 30, 1995

[30] Foreign Application Priority Data

Jan. 31, 1994 [JP] Japan .................................. 6-009651

[51] Int. Cl.$^6$ .............................. G06F 19/00; G06G 7/48
[52] U.S. Cl. ................................ 364/468.04; 364/468.28; 364/578; 395/120
[58] Field of Search ..................... 364/468, 578, 364/488–491, 474.24, 468.04, 468.28; 395/120–127, 161, 141

[56] References Cited

U.S. PATENT DOCUMENTS

| 4,912,664 | 3/1990 | Weiss et al. | 364/577 |
| 5,282,140 | 1/1994 | Tazawa et al. | 364/468 |
| 5,367,465 | 11/1994 | Tazawa et al. | 364/468 |
| 5,377,118 | 12/1994 | Leon et al. | 364/468 |
| 5,379,225 | 1/1995 | Tazawa et al. | 364/468 |
| 5,416,729 | 5/1995 | Leon et al. | 364/578 |

FOREIGN PATENT DOCUMENTS 3101150  4/1991  Japan .
4309183  10/1992  Japan .

OTHER PUBLICATIONS

M.S. Mock; "Tetrahedral Elements and the Scharfetter–Gummel Method"; Proc. of the NASECODE IV (1985); pp. 36–47.

S. Müller, et al.; "Automatic Rectangle based Adaptive Mesh Generation Without Obtuse Angles"; Federal Institute of Technology at Zurich (ETH) Integrated Systems Laboratory Technical Report No. 91/2; pp. 1–18.

Primary Examiner—Paul P. Gordon
Assistant Examiner—Thomas E. Brown
Attorney, Agent, or Firm—Whitham, Curtis, Whitham & McGinn

[57] ABSTRACT

A mesh generator includes a mesh generation processing unit for setting a two-dimensional triangular mesh satisfying the conditions of the Delaunay partitioning on a semiconductor device to be analyzed, a triangular element deletion unit for deleting a predetermined mesh node and a mesh edge linking with the mesh node from the set mesh, a vertex selection unit for setting a new triangular mesh satisfying the conditions of the Delaunay partitioning in a polygon formed in a region from which the mesh node and the mesh edge are deleted without adding a new mesh node, and a triangular element generation unit.

12 Claims, 14 Drawing Sheets

210 ADDITIONAL MESH POINT

MESH GENERATOR AND GENERATING METHOD

BACKGROUND OF THE INVENTION

1. Field of the Invention

The present invention relates to a mesh generating method for generating triangular or tetrahedral meshes on a semiconductor device to be analyzed in device simulation techniques, and more particularly, to a mesh generator for generating meshes made up of triangular or tetrahedral elements.

2. Description of the Related Art

In fabricating semiconductor devices, simulation is commonly performed employing a device simulator which computes physical quantities within a semiconductor device by using a computer to calculate such electric characteristics of the semiconductor device as a terminal current and a threshold voltage. In making an optimization design so that a semiconductor device will exhibit optimal electric characteristics, use of a device simulator enables more drastic reduction of both costs and time required than by experimental fabrication of actual LSIs. In addition, by using the device simulator, which calculates physical quantities within a semiconductor device, it is possible to examine behavior of electrons and holes in a semiconductor. Such examination leads to an analysis of causes of impact ionization phenomenon, one of the problems of a miniaturized MOSFET.

In device simulation, in order to obtain physical quantities within a semiconductor device, change of isolation in the semiconductor is analyzed by solving partial differential equations such as the Poisson equation expressing a relationship between a potential and a carrier concentration and a current continuity equation. One solution of such partial differential equations is to divide a semiconductor device into small areas and discretize a partial differential equation. When in dividing a semiconductor device into small areas, it is a common practice to divide the device into small triangular areas (triangular elements) for a two-dimensional simulation analysis and into small terahedral areas (terahedral elements) for a three-dimensional simulation analysis in order to precisely represent a configuration and a structure of the semiconductor device.

In a simulation based on the finite difference method, the control volume method is used for the discretization of a fundamental equation to be solved. The control volume method will be described in the following with reference to two-dimensional triangular meshes generation through partitioning an analysis space into triangular elements.

Taking such a part of a triangular mesh as shown in FIG. 14 as an example, a polygon, indicated by a broken line in the figure, is referred to as a control volume, which is formed by a vertical bisector of each of mesh edges <IH>, <IJ>, <IK>, <IL>, <IM> and <IN> joining the mesh node (I) and mesh nodes (H, J, K, L, M, N), respectively. The vertical bisector line segment is referred to as a cross-section for the mesh edge. Polygonal vertexes O, P, Q, R, S and T of the control volume are circumcenters (the center of a circumcircle) of corresponding triangular elements of the mesh. In the control volume method, a flow of physical quantities along a mesh edge is represented by multiplying a density of the flow along the mesh edge by a length of a side (also referred to as a cross-section in two-dimensional meshes) of a control volume. For example, multiplication of a current density along the mesh edge <IJ> by a length of the cross-section <OP> will be a current along the mesh edge <IJ>.

Depending on a shape of a triangular mesh, however, there is such a case in which a control volume fails to form a polygon as shown in FIG. 15. In this case, a cross-section <OP> of the control volume takes a negative length, so that a flow of physical quantities on the mesh edge <IJ> will be in an opposite direction to a density of the flow. In such a case, the analytical error increases.

Generation of a cross-section with a negative length occurs when there exists, within a circumcircle of a triangular element in a triangular mesh, a mesh node of other triangular elements. Therefore, in order to create a triangular mesh without a cross-section with a length of negative value, Delaunay partitioning is employed. Delaunay partitioning is a triangulation that no mesh nodes of other triangular elements exists within a circumcircle of each triangular element.

In device simulation techniques, the larger the number of divisions of a mesh is which is generated on a semiconductor device to be analyzed, the higher precision a simulation analysis obtains. However, the number of mesh nodes and mesh edges increases with the number of divisions of a mesh. As a result, the volume of numerical calculations and time for the calculations increase drastically. In practice, an upper limit is placed upon the number of divisions of a mesh to be generated on a semiconductor device, that is, the number of small areas to be formed in a mesh. In analyzing a MOS transistor, improvement of analysis precision is achieved, without increasing the number of divisions of the mesh, by generating, for example, fine meshes in the vicinity of a junction portion between a source and a drain and coarse meshes in a substrate region to vary a density of meshes according to the structure of a semiconductor device to be analyzed. One of such techniques is recited in Patent Laying-Open No. 3-101150. The article recites a technique for interactively generating two-dimensional meshes with reference to an impurity density of a semiconductor device.

One of the methods for making finer meshes out of initial meshes created based on the Delaunay partitioning by adding mesh nodes while maintaining the Delaunay partitioning is the recursive method recited in M. S. Mock, "Proc. of the NASECODE IV", pp. 36–47, 1985.

With reference to a flow chart shown in FIG. 16, mesh node addition processing according to the recursive method will be described taking a triangular mesh shown in FIG. 17 as an example.

First, an additional mesh node 210 is provided on the triangular mesh, and triangular elements containing the additional mesh node 210 within its circumcircle are found as illustrated in FIG. 18 (Step 1601). Then, the found triangular element is deleted from the mesh as shown in FIG. 19 (Step 1602). Then, each vertex of a polygon, which is generated as a result of the deletion of the triangular element, is joined to the additional mesh node 210 to create a triangular mesh made up of triangular elements as illustrated in FIG. 20. Thus obtained new triangular elements satisfy the conditions of the Delaunay partitioning.

Another method for making meshes finer by adding mesh nodes while maintaining the Delaunay partitioning is the Octree method recited in "Automatic Rectangle-based Adaptive mesh Generation Without Obtuse Angle" (S. Müller, K. Kells, W. Fichtner, "Federal institute of Technology at Zurich (ETH)" Integrated Systems Laboratory Technical Report No. 91/2". This method is to make meshes finer by using not triangular meshes generated based on the Delaunay partitioning but rectangular meshes as initial meshes. A mesh satisfying the conditions of the Delaunay partitioning can be obtained by partitioning each small rectangular area (rectangular element) in the rectangular mesh by a diagonal line. Taking the division shown in FIG. 21 as an example, a circumcircle of each of triangular elements IJK and ILJ generated by dividing the rectangular element ILJK coincides with that of the original rectangular element and contains no mesh node of other elements, which fulfill the conditions of the Delaunay partitioning.

For generating a mesh comprised of three-dimensional small areas satisfying the conditions of the Delaunay partitioning on a semiconductor device to be analyzed and re-establishing the mesh while maintaining the Delaunay partitioning, there is a technique recited in Japanese Patent Laying-Open No. 4-309183. The article discloses a method of generating three-dimensional terahedral meshes by joining vertexes of an objective solid (three-dimensional device structure etc.) to generate an initial mesh made up of three-dimensional terahedral elements satisfying the conditions of the Delaunay partitioning, and dividing terahedral elements bridging structural boundaries of the objective solid to prevent every terahedral element from bridging the structural boundaries of the objective solid. The process of such division processing leads to refinement of three-dimensional terahedral meshes.

Regarding two-dimensional meshes, the above-described conventional mesh generation methods enable meshes to be made finer by adding new mesh nodes while ensuring the Delaunay partitioning for triangular elements. It is therefore possible to execute a numerical analysis with high precision for simulation analyses. According to these methods, however, it is impossible to delete mesh nodes to make meshes coarser. As a result, the amount of memory of a computer necessary for the execution of numerical calculations and computation time for processing greatly increase by the degree of the refinement of a mesh obtained by increasing the number of divisions of a mesh.

In addition, it is necessary to decide an upper limit of number of generated mesh elements in order to avoid an increase in memory consumption and computation time. In the above case, it is necessary to generate coarse meshes having the small number of mesh nodes on a semiconductor device to be analyzed beforehand and add mesh nodes such that the number of mesh nodes or divisions of a mesh will not exceed the upper limit. Such a process is, however, troublesome and time-consuming.

As well as the above case of two-dimensional meshes described in Patent Laying-Open No. 3-101150, according to the above-described mesh generation method for three-dimensional meshes, it is possible to make meshes finer by increasing the number of mesh nodes, but not possible to make them coarser by decreasing the number of mesh nodes. In addition, there is a case where the Delaunay partitioning is not ensured for terahedral elements newly generated by adding mesh nodes. In such a case, analysis precision might not be improved even if the number of mesh nodes is increased.

SUMMARY OF THE INVENTION

A first object of the present invention is to provide a mesh generator capable of making meshes, which satisfy the conditions of the Delaunay partitioning, coarse by reducing the number of mesh nodes while ensuring the Delaunay partitioning.

A second object of the present invention is to provide a mesh generator capable of avoiding an increase in memory consumption and computation time while improving analysis precision, by setting finer meshes in a region of a semiconductor device which requires higher analysis precision and coarser meshes in a region which will not adversely affect the analysis precision.

According to one aspect of the invention, a mesh generator is provided comprising:

mesh generating means for setting on a semiconductor device to be analyzed a first two-dimensional triangular mesh satisfying the conditions of the Delaunay partitioning;

mesh deleting means for deleting a predetermined mesh node and a mesh edge linking with the mesh node from the set mesh; and mesh re-generating means for setting, in a polygonal area formed by deleting said mesh node and said mesh edge, a new second triangular mesh which satisfies the conditions of the Delaunay partitioning and is coarser than said first triangular mesh.

In the preferred construction, the mesh re-generating means comprises:

triangular element extracting means for extracting, out of triangles formed by an arbitrary side of said polygonal area generated by deleting the mesh node and the mesh edge and a vertex not included in the side, a triangle whose circumcircle is the smallest as a triangular element constituting said second triangular mesh; and control means for repeatedly executing triangular element generation processing by said triangular element generating means until said triangular element is formed with respect to every side of said polygon.

In another preferred construction, the triangular element extracting means comprises:

vertex selecting means for selecting a vertex at which an angle is the largest with a side arbitrarily selected out of said polygonal area formed by deleting the mesh node and the mesh edge; and triangular element generating means for joining said selected side to a vertex to generate a triangular element.

Also, the mesh generator preferably further comprises mesh re-generating means for adding a mesh node to a predetermined area of a semiconductor device on which a mesh is set, to set a new third triangular mesh containing the added mesh node and satisfying the conditions of the Delaunay partitioning.

According to another aspect of the invention, a mesh generator is provided comprising:

mesh generating means for setting on a semiconductor device to be analyzed a first three-dimensional terahedral mesh satisfying the conditions of the Delaunay partitioning;

mesh deleting means for deleting a predetermined mesh node and a mesh edge linking with the mesh node from the set mesh; and mesh re-generating means for setting, in a polyhedral area formed by deleting said mesh node and said mesh edge, a new second terahedral mesh which satisfies the conditions of the Delaunay partitioning and is coarser than said first terahedral mesh.

In the preferred construction, the mesh re-generating means comprises:

terahedral element extracting means for extracting, out of terahedrons formed by an arbitrary face of said polyhedral area generated by deleting the mesh node and the mesh edge and a vertex not included in the face, a terahedron whose circumsphere is the smallest as a terahedral element constituting said second new terahedral mesh; and control means for repeatedly executing terahedral element generation processing by said terahedral element generating means until said terahedral element is formed with respect to every face of said polyhedron.

Also, the mesh generator preferably further comprises mesh re-generating means for adding a mesh node to a predetermined area of a semiconductor device on which a mesh is set, to set a new third terahedral mesh containing the added mesh node and satisfying the conditions of the Delaunay partitioning.

According to a further aspect of the invention, a mesh generating method is provided comprising the steps of:

setting on a semiconductor device to be analyzed a first two-dimensional triangular mesh satisfying the conditions of the Delaunay partitioning;

deleting a predetermined mesh node and a mesh edge linking with the mesh node from the set mesh; and setting a new second triangular mesh which satisfies the conditions of the Delaunay partitioning and is coarser than said first triangular mesh in a polygonal area formed by deleting said mesh node and said mesh edge without adding a new mesh node.

In this case, the step of setting a new second triangular mesh preferably comprises the steps of:

extracting, out of triangles formed by an arbitrary side of said polygonal area generated by deleting the mesh node and the mesh edge and a vertex not included in the side, a triangle whose circumcircle is the smallest as a triangular element constituting said new second triangular mesh; and repeatedly executing triangular element generation processing by said triangular element generating means until said triangular element is formed with respect to every side of said polygon.

In the above-mentioned construction, the step of extracting a triangular element comprise the steps of:

selecting a vertex at which an angle is the largest with a side arbitrarily selected out of a polygon formed in said area where the mesh node and the mesh edge are deleted;

joining said selected side to a vertex to generate a triangular element.

According to a still further aspect of the invention, a mesh generating method is provided comprising the steps of:

setting on a semiconductor device to be analyzed a first three-dimensional terahedral mesh satisfying the conditions of the Delaunay partitioning;

deleting a predetermined mesh node and a mesh edge linking with the mesh node from the set mesh; and setting a new second terahedral mesh which satisfies the conditions of the Delaunay partitioning and is coarser than said first terahedral mesh to a polyhedral area formed by deleting said mesh node and said mesh edge without adding a new mesh node.

In the above-mentioned construction, the step of setting a new second triangular mesh preferably comprises the steps of:

extracting, out of terahedrons formed by an arbitrary face of said polyhedron formed in the area where the mesh node and the mesh edge are deleted and a vertex not included in the face, a terahedron whose circumsphere is the smallest as a terahedral element constituting said new second terahedral mesh; and repeatedly executing terahedral element generation processing by said terahedral element generating means until said terahedral element is formed with respect to every face of said polyhedron.

Other objects, features and advantages of the present invention will become clear from the detailed description given here below.

BRIEF DESCRIPTION OF THE DRAWINGS

The present invention will be understood more fully from the detailed description given here below and from the accompanying drawings of the preferred embodiments of the invention, which, however, should not be taken to be limitative to the invention, but are for explanation and understanding only.

In the drawings.

DESCRIPTION OF THE PREFERRED EMBODIMENTS

Figure 1:
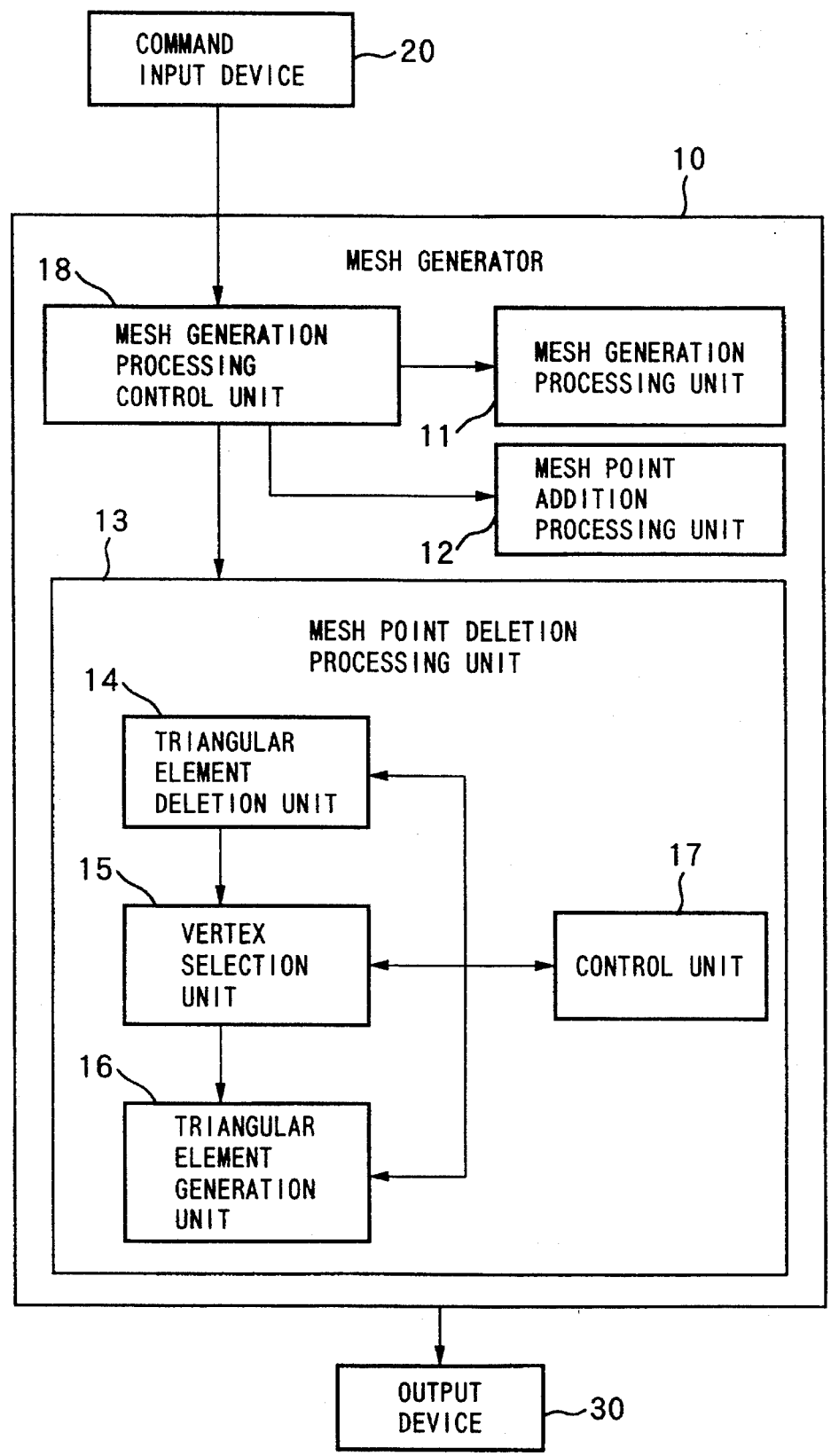
FIG. 1 is a block diagram showing an arrangement of a mesh generator according to a first embodiment of the present invention.
Figure 2:
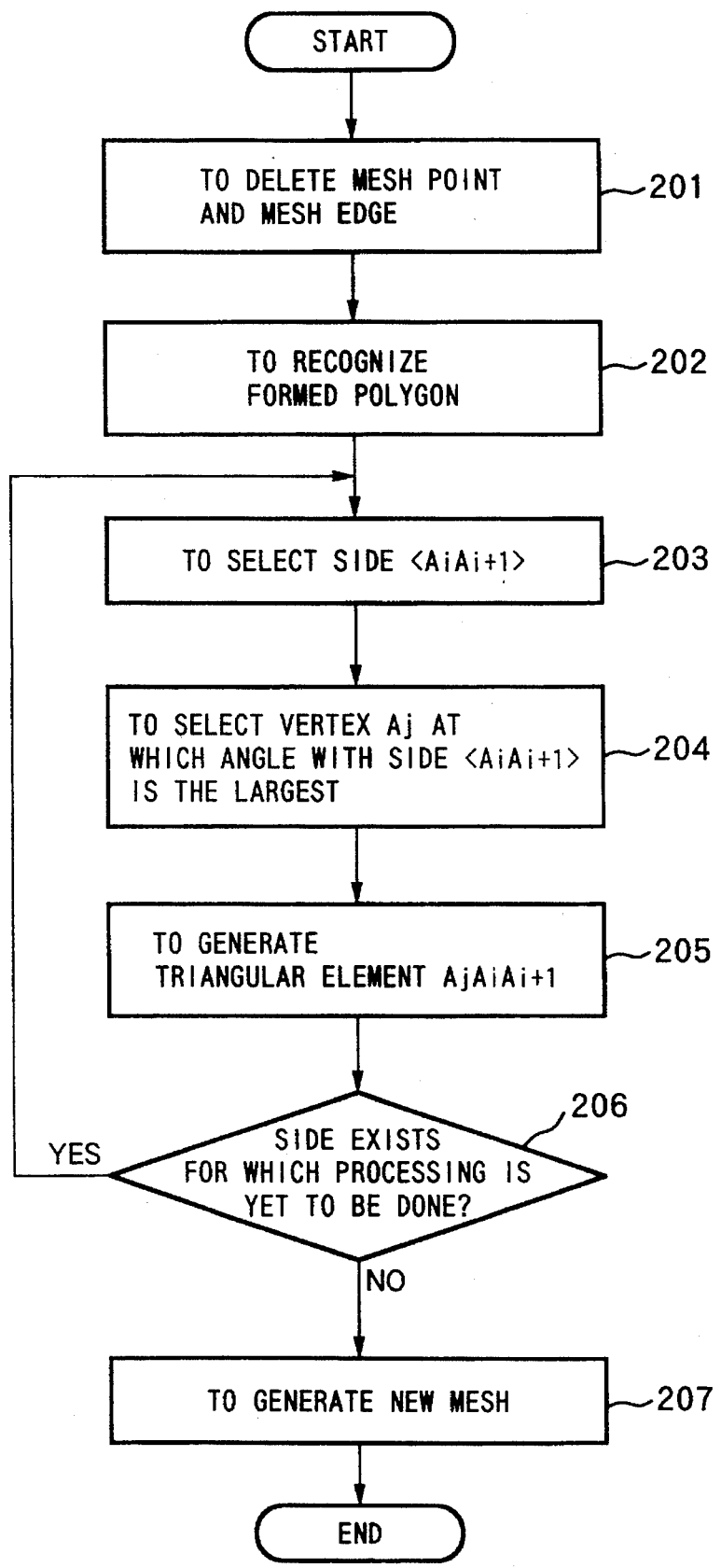
FIG. 2 is a flow chart illustrating operation of a mesh node deletion processing unit of the present embodiment.

Preferred embodiments of the present invention will be described in detail with reference to accompanying drawings. FIG. 1 is a block diagram showing an arrangement of a mesh generator according to a first embodiment of the present invention. The mesh generator of the present embodiment generates a two-dimensional triangular mesh on a semiconductor device to be analyzed.

As shown in the figure, a mesh generator 10 of the present embodiment comprises a mesh generation processing unit 11 for generating a triangular mesh on a semiconductor device to be analyzed, a mesh node addition processing unit 12 for adding a mesh node to a generated triangular mesh to make it finer, a mesh node deletion processing unit 13 for deleting a mesh node of a generated triangular mesh to make it coarser, and a mesh generation processing control unit 18 for controlling operation of these units. The mesh generator 10 is connected to a command input device 20 for inputting various instruction commands for executing processing and an output device 30 for outputting processing results.

The mesh generator 10 is implemented in a personal computer, a workstation or the like. The mesh generation processing unit 11 generates a triangular mesh on a semiconductor device to be analyzed. In thus generated triangular mesh, a triangular element is formed satisfying the conditions of the Delaunay partitioning.

The mesh node addition processing unit 12 is implemented by a CPU of a personal computer, a workstation or the like. The mesh node addition processing unit 12 adds a mesh node to a predetermined area of a semiconductor device where a triangular mesh is generated and re-generates the triangular mesh to make the mesh in the area finer. As a technique for re-generating a triangular mesh by adding a mesh node, commonly owned co-pending U.S. patent application Ser. No. 08/306,970 (pending) is herein incorporated by reference.

The mesh node deletion processing unit 13, to be implemented by a CPU of a personal computer, a workstation or the like, comprises a triangular element deletion unit 14, a vertex selection unit 15, a triangular element generation unit 16 and a control unit 17 as illustrated in the figure. The mesh node deletion processing unit 13 deletes a mesh node from a predetermined area of a semiconductor device where a triangular mesh is generated and re-generates the triangular mesh to make the mesh in the area coarser.

The triangular element deletion unit 14 deletes a mesh node designated to be deleted and every mesh edge linked with the mesh node. As a result, all of the triangular elements containing the mesh node are deleted to form a polygon having sides and vertexes as many as the number of the deleted triangular elements.

The vertex selection unit 15 selects a vertex at which an angle is the largest with a predetermined side of the polygon formed after the deletion of the triangular elements.

The triangular element generation unit 16 joins a selected vertex to the opposite ends of the side in question, thereby forming a new triangular element. Because thus formed triangular element links the side in question with a vertex at which an angle with the side is the largest, its circumcircle has a diameter smaller than that of a circumcircle of any other triangle made by linking the side in question with other vertexes. The circumcircle of this triangle accordingly contains none of the other vertexes and the triangular element satisfies the conditions of the Delaunay partitioning.

The control unit 17 controls operation of these units and repeatedly executes the triangular element generation processing until a polygonal area formed by deleting triangular elements will be filled with new triangular elements satisfying the conditions of the Delaunay partitioning.

The mesh generation processing control unit 18 is implemented by a CPU of a personal computer, a workstation or the like. The mesh generation processing control unit 18 controls operation of the above-described processing units 11, 12 and 13 according to instruction commands applied through the command input device 20 to generate an initial mesh on a semiconductor device to be analyzed through the mesh generation processing unit 11 or re-generate a mesh through the mesh node addition processing unit 12 or the mesh node deletion processing unit 13 as required. This process leads to generation of an appropriate mesh corresponding to the structure of the semiconductor device.

The command input device 20 is implemented by an input device such as a keyboard or a mouse. The output device 30 is implemented by a display, a printer or the like. An analyzer is allowed to add and delete a mesh node through the command input device 20 while referring to a mesh on a semiconductor device displayed on or printed out by the output device 30 to generate an appropriate mesh.

With reference to the flow chart of FIG. 2 and FIGS. 3 to 9, operation of the mesh node deletion processing unit 13 of the present embodiment will be described.

Figure 3:
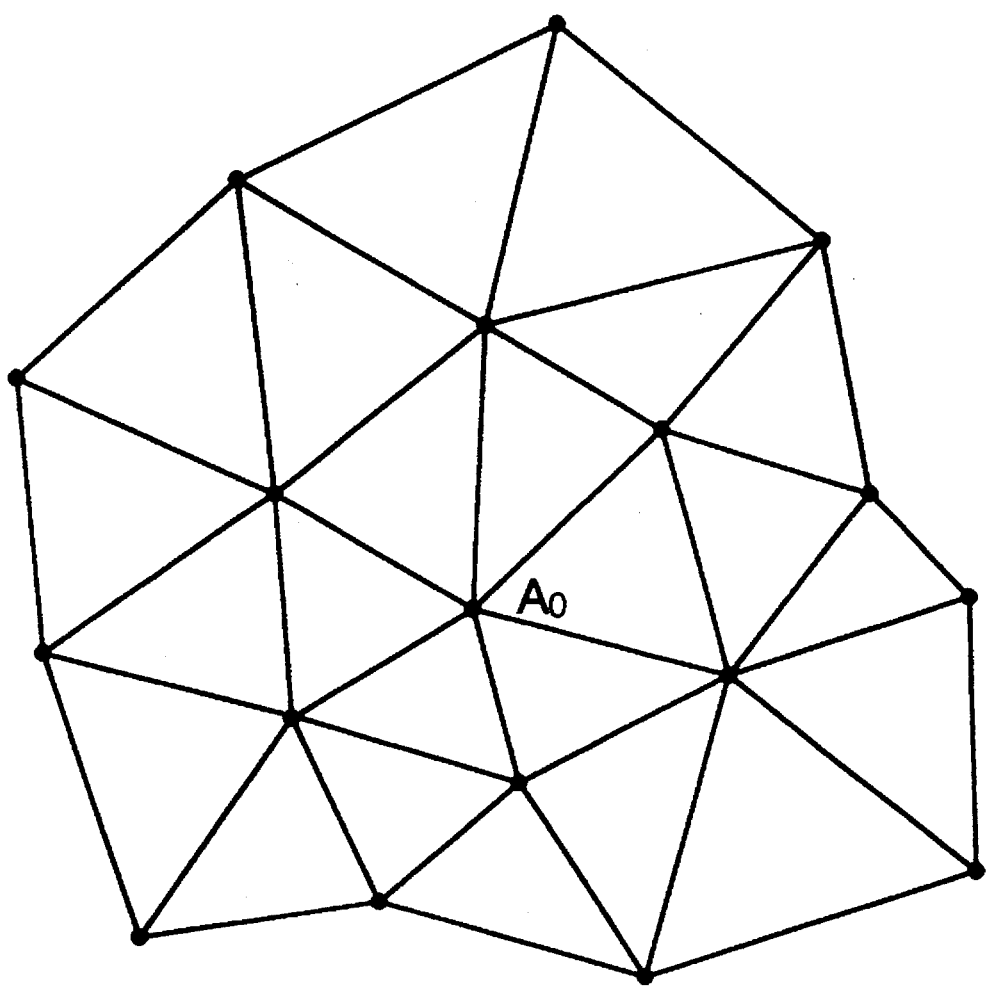
FIG. 3 is a diagram illustrating an example of execution of the mesh node deletion processing according to the present embodiment.
Figure 4:
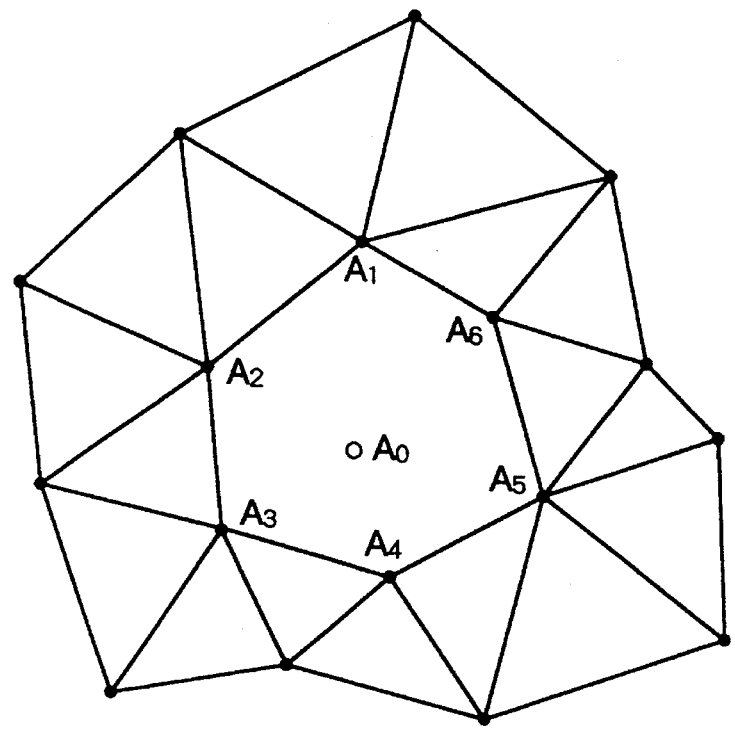
FIG. 4 is a diagram illustrating an example of execution of the mesh node deletion processing according to the present embodiment.

For a triangular mesh satisfying the conditions of the Delaunay partitioning shown in FIG. 3, when a mesh node A0 to be deleted is designated through the command input unit 20, the mesh generation processing control unit 18 controls the triangular element deletion unit 14 in the mesh node deletion processing unit 13 to delete the mesh node A0 and every mesh edge joined to the node A0 (Step 201). As a result, a polygon A1A2 ... An is formed surrounding the deleted node A0 as shown in FIG. 4. In the example of FIG. 4, n is 6.

Figure 5:
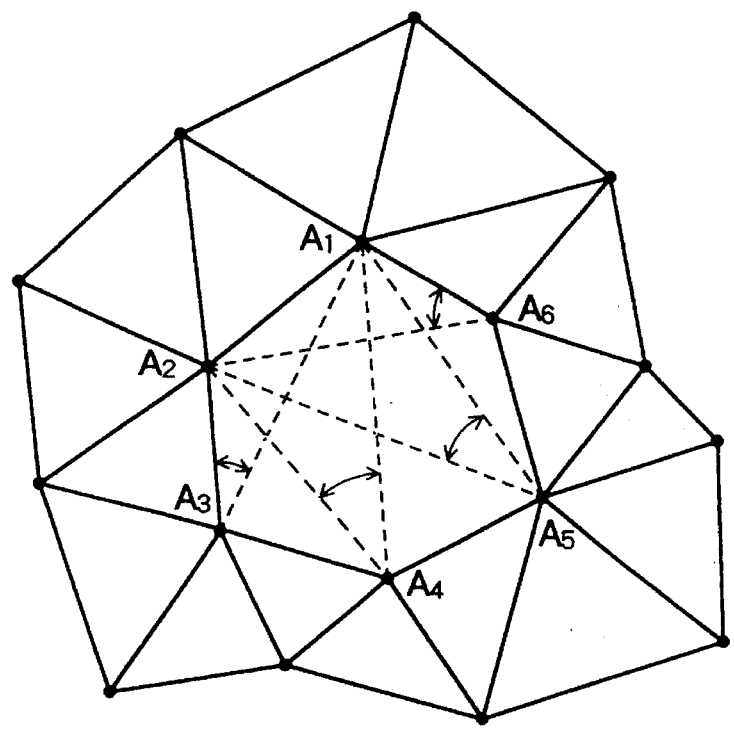
FIG. 5 is a diagram illustrating an example of execution of the mesh node deletion processing according to the present embodiment.
Figure 6:
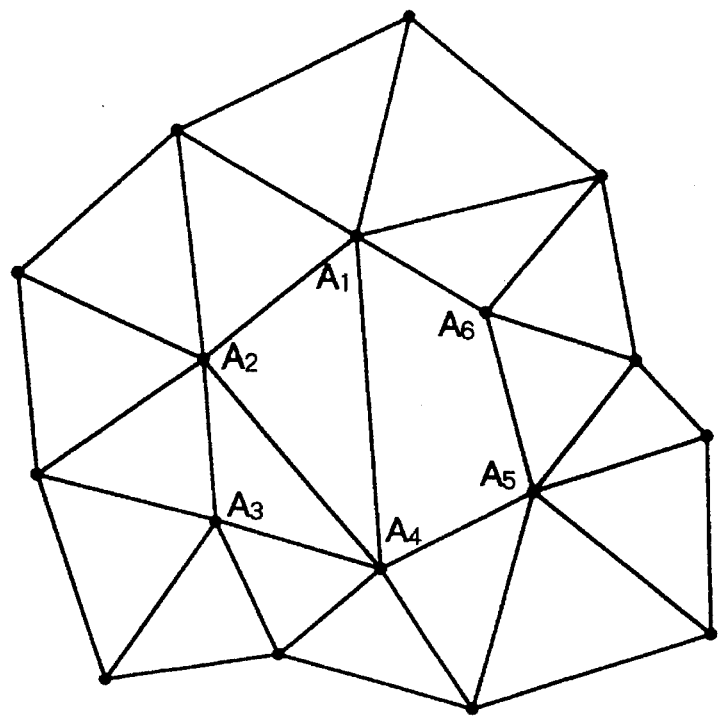
FIG. 6 is a diagram illustrating an example of execution of the mesh node deletion processing according to the present embodiment.

Next, the vertex selection unit 15 recognizes the formed polygon A1A2 ... An (Step 202) to select a predetermined side <AiAi+1> (Step 203). Then, out of the respective vertexes other than Ai and Ai+1 which are located at the opposite ends of the selected side <AiAi+1>, a vertex Aj is found at which an angle with the side <AiAi+1> is the largest (Step 204). Taking FIG. 4 as an example where i is initially 1, the vertex selection unit 15 selects the side <A1A2> of the polygon A1A2 ... A6. Then, a vertex making the largest angle with the side <A1A2> is found out of the vertexes A3, A4, A5 and A6 as shown in FIG. 5. In FIG. 5, the vertex A4 is to be selected.

Figure 7:
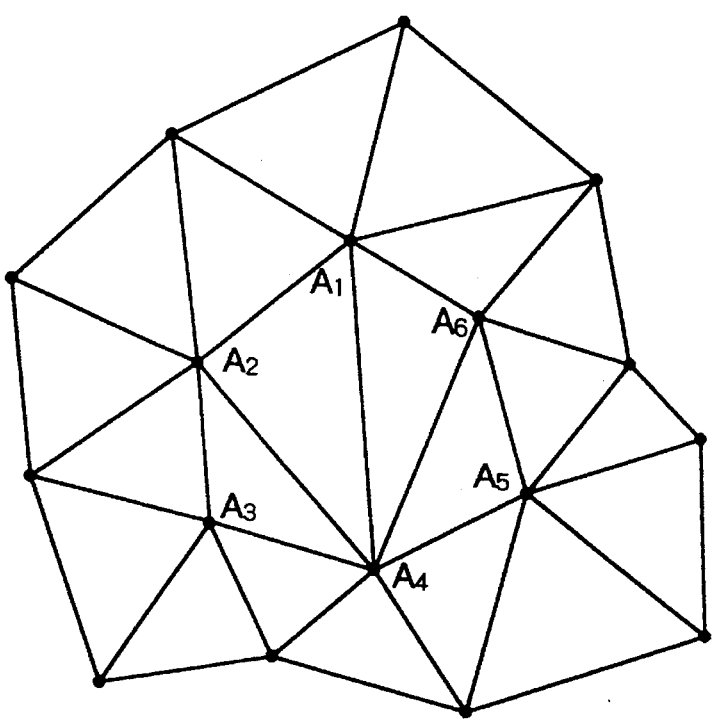
FIG. 7 is a diagram illustrating an example of execution of the mesh node deletion processing according to the present embodiment.

Here, selection of the A4 as the vertex forming the largest angle with the side <A1A2> results in a circumcircle of the triangle A4A1A2 being the smallest among the circumcircles of triangles each formed by linking the side <A1A2> with one of the vertexes A3, A4, A5 and A6. The circumcircle S (A4A1A2) of the triangle A4A1A2 therefore contains none of the vertexes A3, A5 and A6. In addition, an area where the circumcircle S (A4A1A2) goes outside the polygon A1A2 . . . A6 is smaller than an overlap of circumcircles of the respective triangles containing the deleted mesh node A0, as shown in FIG. 7. The circumcircle of each triangle containing the deleted node A0 basically contains no other mesh nodes because the mesh satisfies the conditions of the Delaunay partitioning. Neither the circumcircle S (A4A1A2) of the selected triangle A4A1A2 accordingly contains none of other mesh nodes located outside the polygon A1A2 . . . A6. As a result, the circumcircle S (A4A1A2) contains no other mesh node therewithin, so that the triangular element A4A1A2 fulfills the conditions of the Delaunay partitioning.

The triangular element generation unit 16 joins the vertex Aj selected in a manner as described above to the side <AiAi+1> to form a new triangular element AjAiAi+1 (Step 205). In the example illustrated in FIG. 8, a triangular element A4A1A2 is generated.

Figure 8:
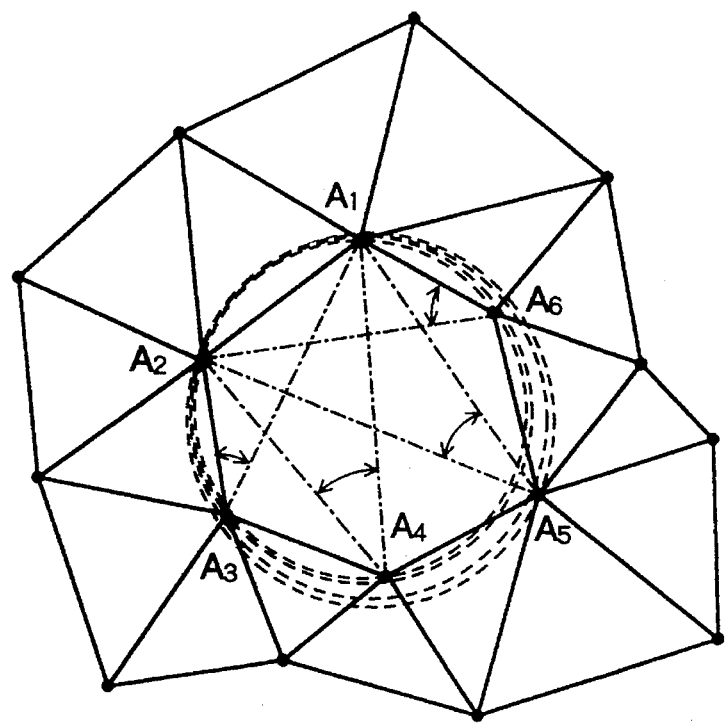
FIG. 8 is a diagram illustrating an example of execution of the mesh node deletion processing according to the present embodiment.
Figure 9:
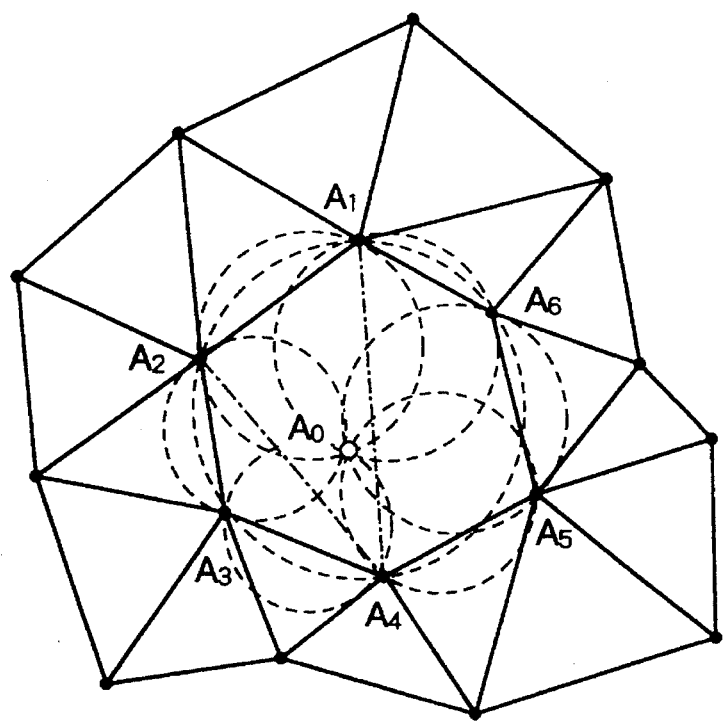
FIG. 9 is a diagram illustrating an example of execution of the mesh node deletion processing according to the present embodiment.

As is clear from FIG. 8, creation of a triangular element A2A3A4 accompanies generation of A4A1A2 here. Thus, when there exists only one other vertex between one end node of the side <AiAi+1> and the selected vertex Aj, a triangular element is concomitantly created with the generation of the triangular element AjAiAi+1. With reference to the figure, it is found that the above-described triangular element A4A1A2 and the concomitant triangular element A2A3A4 share one side <A2A4>. No other vertex therefore exists in an area where the circumcircle S (A4A1A2) of the triangular element A4A1A2 and a circumcircle S (A2A3A4) of the triangular element A2A3A4 overlap with each other because the triangular element A4A1A2 satisfies the conditions of the Delaunay partitioning. In addition, no other vertex of the polygon A1A2 . . . A6 in question exists in a range covered by the circumcircle S (A2A3A4) of the triangular element A2A3A4 but not by the circumcircle S (A4A1A2) of the triangle A4A1A2. This is because it is impossible in a polygon where other vertexes exists in such a range as described above to form a triangular element satisfying the conditions of the Delaunay partitioning by joining one node located within the polygon to each side of the polygon, which fails to meet an initial condition that a triangular element containing the deleted node A0 should satisfy the conditions of the Delaunay partitioning. In addition, since an area where the circumcircle S (A2A3A4) of the triangular element A2A3A4 goes outside the polygon A1A2 . . . A6 is smaller than an overlap of circumcircles of the respective triangles containing the mesh node A0, the circumcircle S (A2A3A4) does not contain other mesh nodes located outside the polygon A1A2 . . . A6. The circumcircle S (A2A3A4) therefore contains no other mesh nodes, so that the triangular element A2A3A4 meets the conditions of the Delaunay partitioning.

The control unit 17 determines whether the processing for generating a new triangular element is completed for each of the sides of the polygon A1A2 A6. When it is not completed for all the sides, the routine goes back to Step 203 to repeatedly execute the vertex selection processing by the vertex selection unit 15 and the new triangular element generation processing by the triangular element generation unit 16 (Step 206). In the illustrated example, the vertex A6 is selected corresponding to the side <A4A5> to generate a new triangular element A4A5A6 as shown in FIG. 8. At the same time, a new triangular element A1A4A6 is created. When a new triangular element is generated corresponding to every side of the polygon A1A2 . . . A6 in this manner, a predetermined mesh node is deleted to generate a new mesh satisfying the conditions of the Delaunay partitioning (Step 207).

When in selecting a side and a vertex for the creation of a new triangular element, an arbitrary side can be selected among those with respect to which processing is yet to be done. In this case, the shape of a generated mesh varies with the first selection of a side. In any case, however, since the conditions of the Delaunay partitioning are maintained during the process of the generation of each triangular element, the Delaunay partitioning is ensured for a finally generated new mesh.

By using the thus arranged mesh generator 10, a density of the mesh can be changed following the procedure set forth below without increasing the total number of meshes.

First, in response to a command applied through the command input device 20, designated are an area where refinement of the mesh is necessary, the number of mesh nodes to be added, an area where the mesh is to be made coarser and the number of mesh nodes to be deleted. The commands for designating these areas are input by an analyzer after observing and determining a state of an initial mesh displayed on or printed out by the output device 30. More specifically, for an area in which analysis precision is to be improved by making meshes finer, a command for the mesh node adding processing is input by the mesh node addition processing unit 12. On the other hand, for an area of which determination is made that coarser meshes will not degrade analysis precision, a command for the mesh node deletion processing is input by the mesh node deletion processing unit 13. In a device analysis of a MOS transistor, for example, mesh nodes are added to the vicinity of a source and drain, PN junction portion respectively, while they are deleted in a substrate region.

The mesh node addition processing 12 adds the designated number of mesh nodes to a designated area based on an applied command. Distribution of additional mesh nodes in a designated area can be designated by a command applied by an analyzer and each of the additional mesh nodes can be designated by using a nodeing device such as a mouse on a display screen of the output device 30. In addition, various ways of addition are possible such as allocation of mesh nodes according a distribution on coordinates determined by random numbers or an equal-interval distribution and allocation of mesh nodes to a circumcenter of a triangular element selected by random numbers.

The mesh node deletion processing unit 13 deletes the designated number of mesh nodes from a designated area based on an input command. A mesh node to be deleted can be designated by a command input by an analyzer or all mesh nodes to be deleted can be designated by using a nodeing device such as a mouse on the display screen of the output device 30. Various ways of deletion are possible, one of which is to determine a mesh node number to be deleted according to random numbers and the other is to set the number of nodes to be deleted for each of equally divided small areas and alternately determine a mesh node to be deleted in ascending or descending order of the mesh node number.

The density of meshes can be thus changed without increasing the number of mesh nodes.

Figure 10:
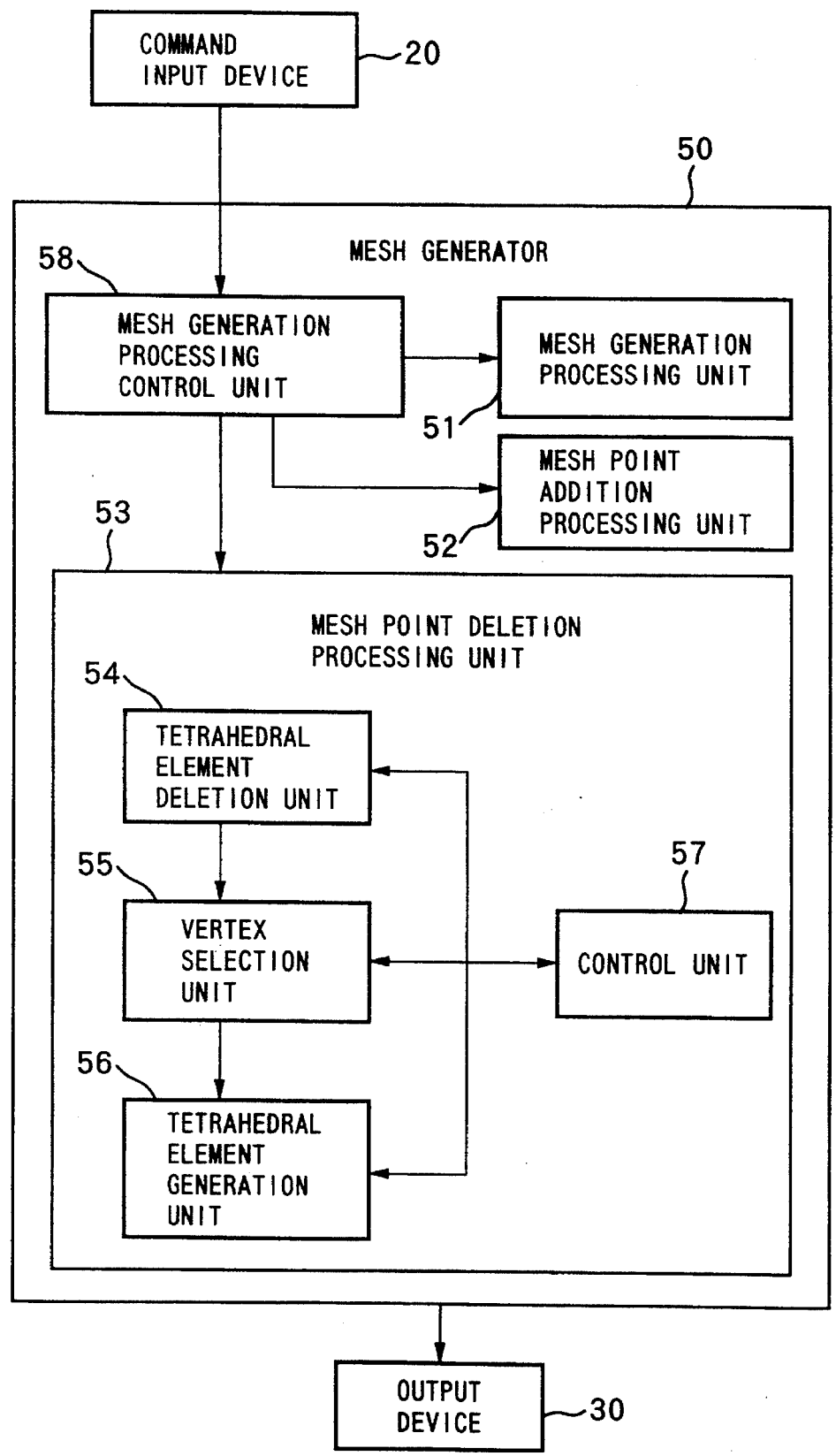
FIG. 10 is a block diagram showing an arrangement of a mesh generator according to a second embodiment of the present invention.

FIG. 10 is a block diagram sowing an arrangement of a mesh generator according to a second embodiment of the present invention. The mesh generator of the present embodiment generates a three-dimensional terahedral mesh on a semiconductor device to be analyzed.

As illustrated in the figure, a mesh generator 50 of the present embodiment comprises a mesh generation processing unit 51 for generating a terahedral mesh on a semiconductor device to be analyzed, a mesh node addition processing unit 52 for adding a mesh node to a generated terahedral mesh to make the mesh finer, a mesh node deletion processing unit 53 for deleting a mesh node of a generated terahedral mesh to make the mesh coarser and a mesh generation processing control unit 58 for controlling operation of these units. The mesh generator 50 is connected to a command input device 20 for inputting various instruction commands for executing processing and an output device 30 for outputting processing results.

The mesh generation processing unit 51, to be implemented by a CPU of a personal computer, a workstation or the like, generates a terahedral mesh on a semiconductor device to be analyzed. In the thus generated terahedral mesh, a terahedral element is formed satisfying the conditions of the Delaunay partitioning.

The mesh node addition processing 52 is implemented by a CPU of a personal computer, a workstation or the like. The mesh node addition processing unit 52 adds a mesh node to a predetermined area of a semiconductor device where a terahedral mesh is generated, to re-generate the terahedral mesh for the refinement of the mesh. As a technique of adding a mesh node to re-generate a terahedral mesh, U.S. patent application Ser. No. 08/306,967 (now abandoned) and U.S. patent application Ser. No. 08/306,970 (pending) are herein incorporated by reference.

The mesh node deletion processing unit 53, to be implemented by a CPU of a personal computer, a workstation or the like, comprises a terahedral element deletion unit 54, a vertex selection unit 55, a terahedral element generation unit 56 and a control unit 57. The mesh node deletion processing unit 53 deletes a mesh node from a predetermined area of a semiconductor device where a terahedral mesh is generated, to re-generate the terahedral mesh for making the mesh in the area coarser.

The terahedral element deletion unit 54 deletes a mesh node designated to be deleted and every mesh edge joined to the designated mesh node. As a result, all terahedral elements containing the mesh node in question are deleted to form a polyhedron in the area in question which has sides and vertexes as many as the number of the deleted terahedral elements.

The vertex selection unit 55 selects, for a predetermined face of a polyhedron formed after the deletion of a terahedral element, a vertex that forms the terahedral element having the smallest circumsphere.

The terahedral element generation unit 56 joins the selected vertex to each vertex of the face in question, thereby forming a new terahedral element. In the thus formed terahedral element, a diameter of its circumsphere is larger than a diameter of a circumsphere of any terahedron formed by joining the face in question to other vertexes. The terahedron in question therefore contains no other vertexes in its circumsphere, so that the terahedral element in question satisfies the conditions of the Delaunay partitioning.

The control unit 57 controls operation of these units and repeatedly executes the terahedral element generation processing until a polygonal area formed as a result of the deletion of terahedral elements will be filled with new terahedral elements satisfying the conditions of the Delaunay partitioning.

The mesh generation processing control unit 58 is implemented by a CPU of a personal computer, a workstation or the like. The mesh generation processing control unit 58 controls operation of the above-described processing units 51, 52 and 53 in response to various commands input through the command input device 20 to generate an initial mesh on a semiconductor device to be analyzed through the mesh generation processing unit 51 or re-generate a mesh through the mesh node addition processing unit 52 or the mesh node deletion processing 53 as required. This process leads to generation of an appropriate mesh corresponding to the structure of the semiconductor device.

The command input device 20 and the output device 30 are the same as those of the command input device 20 and the output device 30 in the above-described first embodiment and allotted the same reference numerals for the omission of their description.

Figure 11:
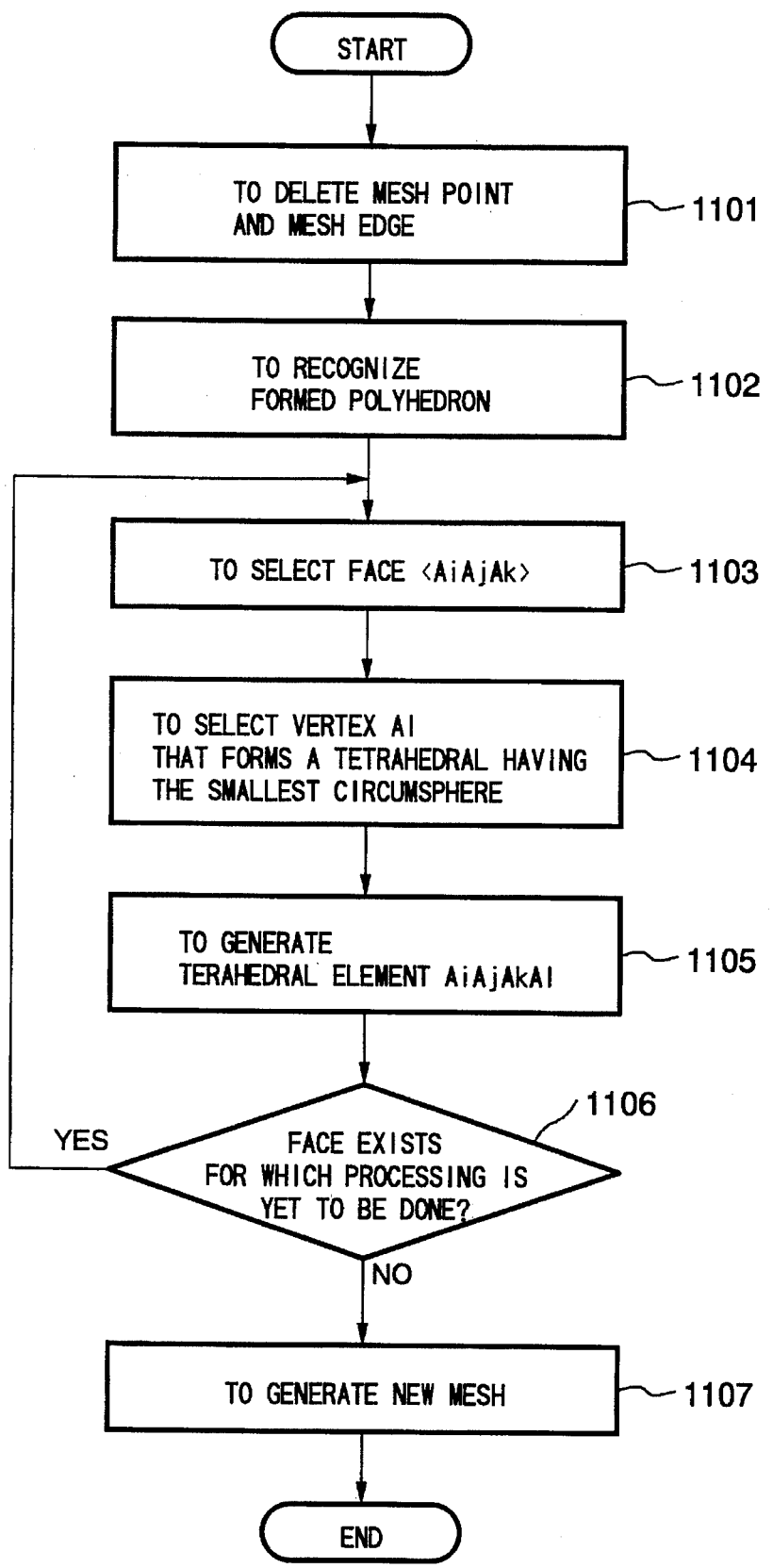
FIG. 11 is a flow chart showing operation of the present embodiment.

With reference to the flow chart of FIG. 11 and FIGS. 12 and 13, operation of the mesh node deletion processing unit 53 according to the present embodiment will be described.

Figure 12:
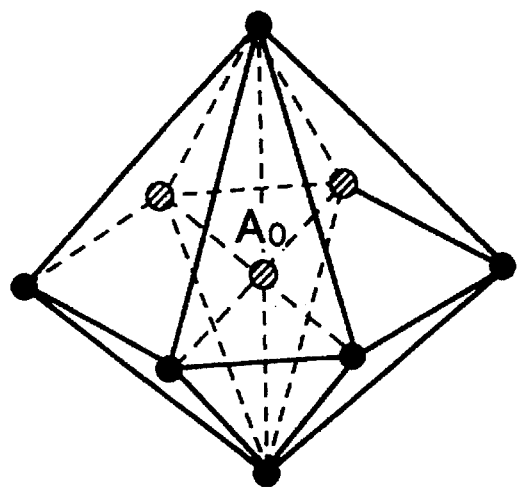
FIG. 12 is a diagram showing an example of execution of mesh node deletion processing according to the present embodiment.
Figure 13:
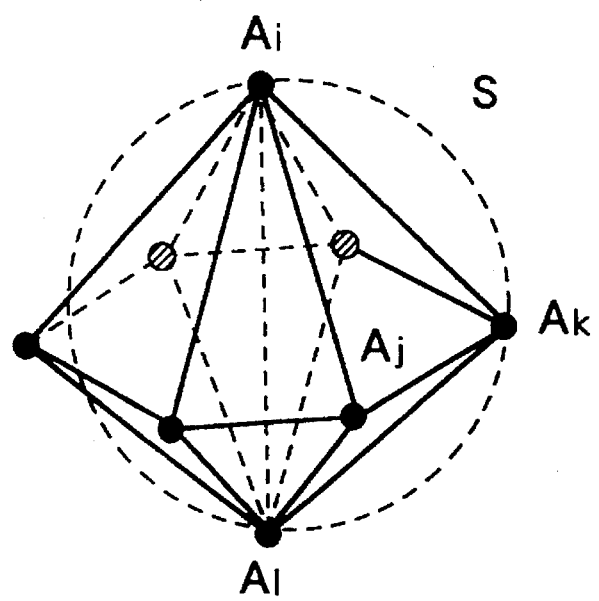
FIG. 13 is a diagram showing an example of execution of a mesh node deletion processing according to the present embodiment.
Figure 14:
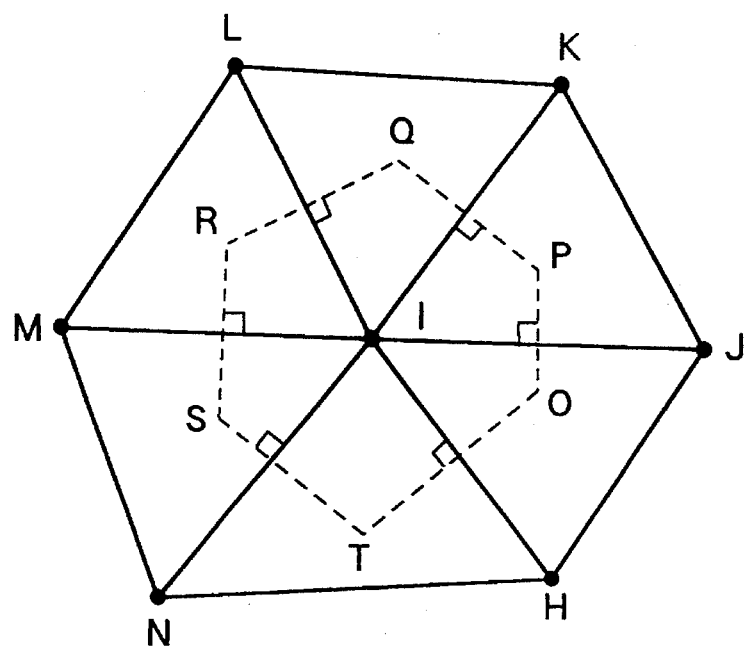
FIG. 14 is a diagram showing an example of a discretization means of a semiconductor device.
Figure 15:
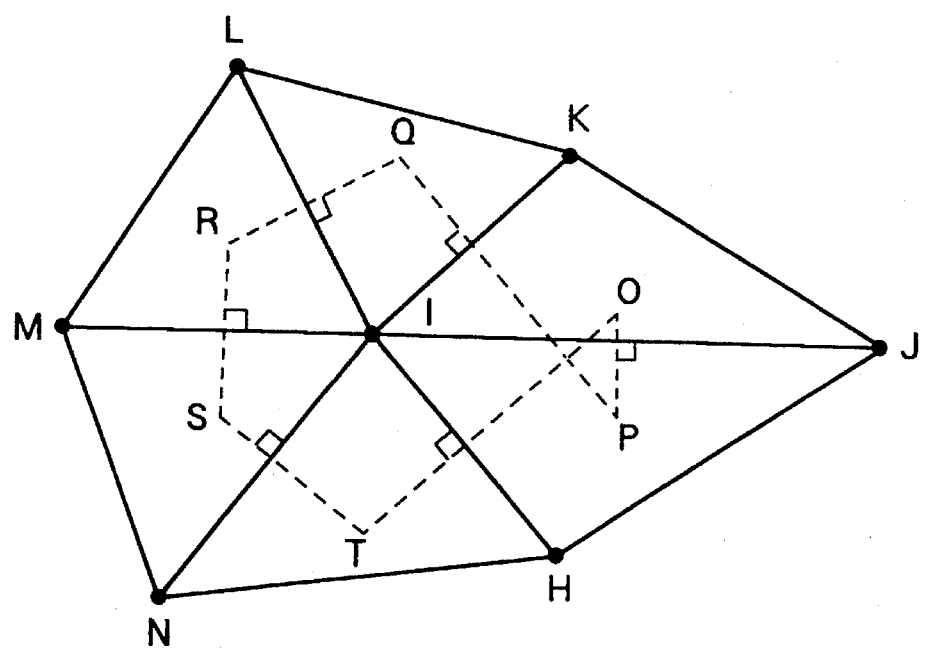
FIG. 15 is a diagram showing an example of a discretization means of a semiconductor device.
Figure 16:
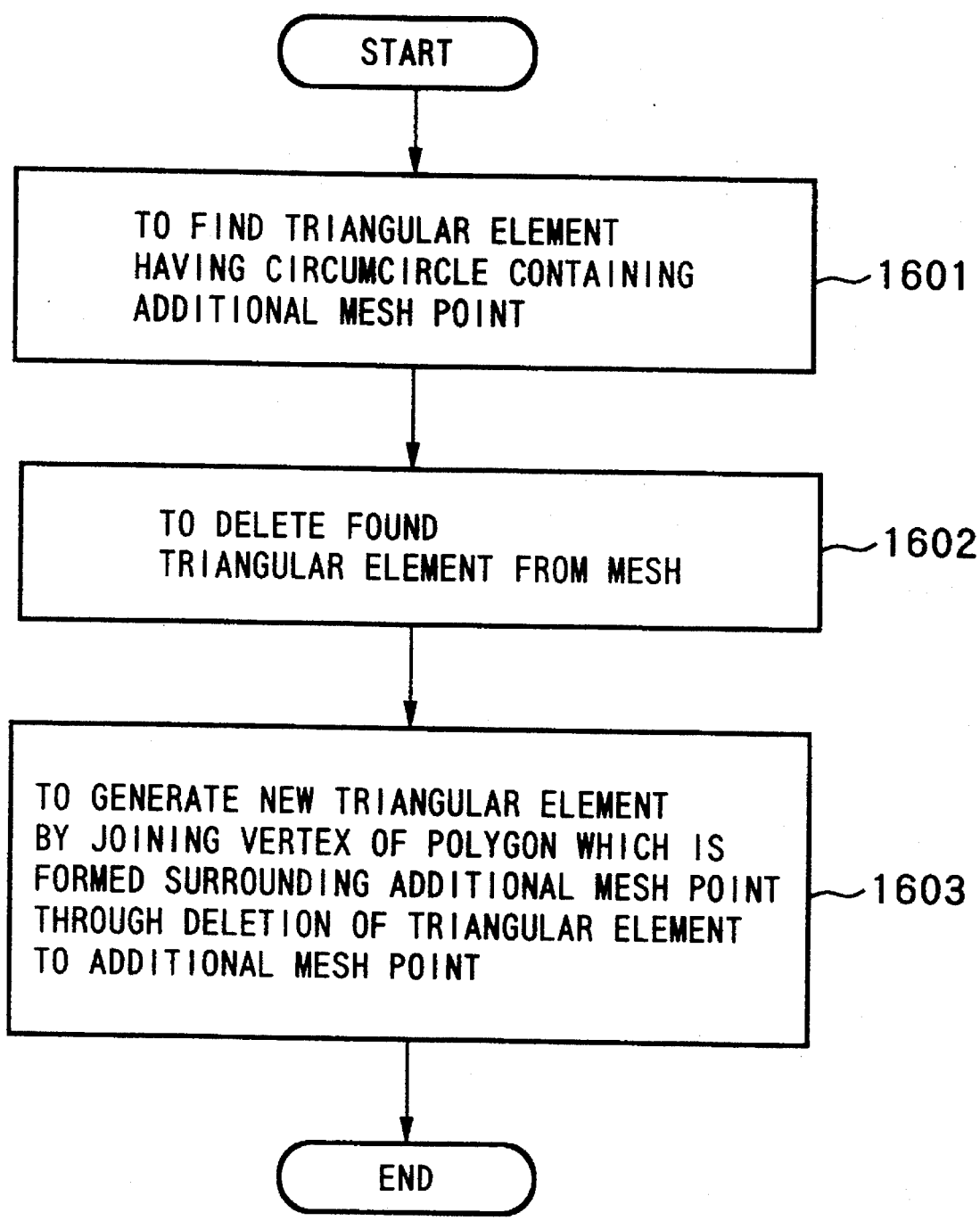
FIG. 16 is a flow chart illustrating processing for adding a mesh node according to the recursive method.
Figure 17:
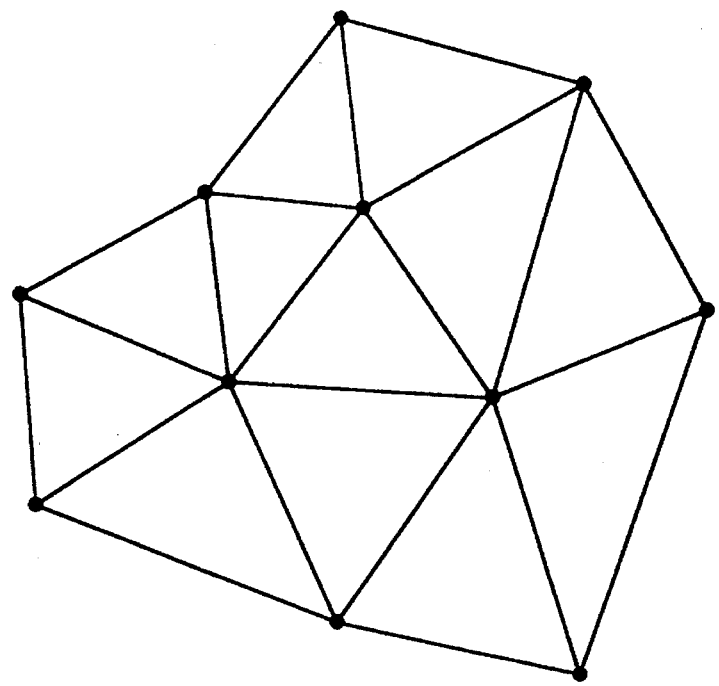
FIG. 17 is a diagram showing an example of execution of mesh node addition processing according to the recursive method.
Figure 18:
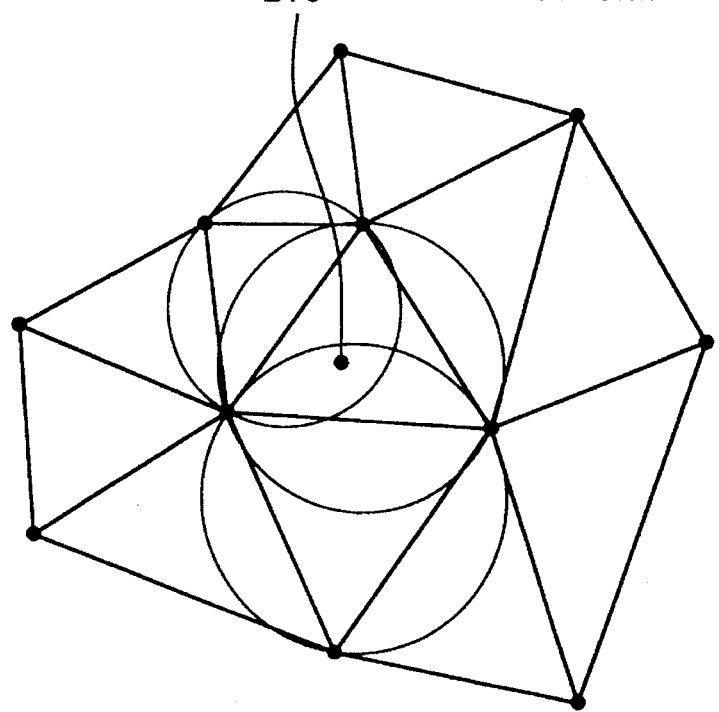
FIG. 18 is a diagram showing an example of execution of mesh node addition processing according to the recursive method.
Figure 19:
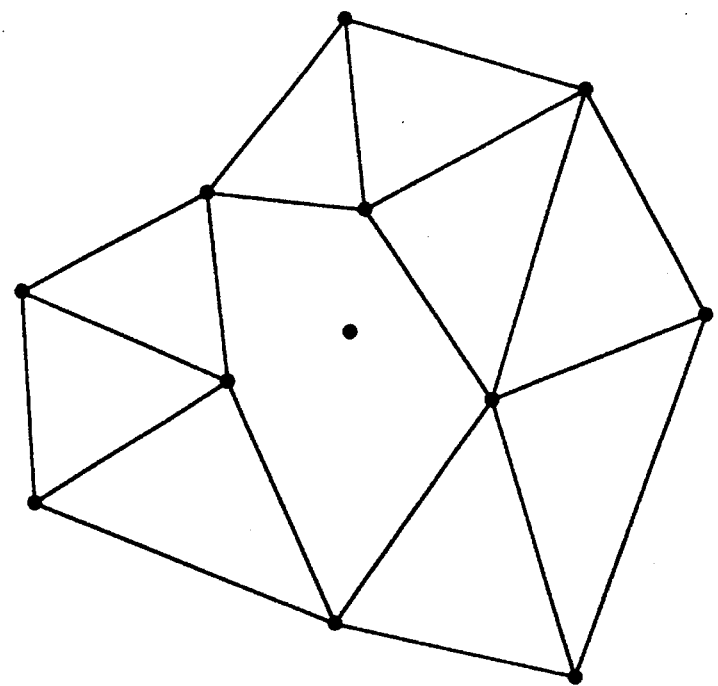
FIG. 19 is a diagram showing an example of execution of mesh node addition processing according to the recursive method.
Figure 20:
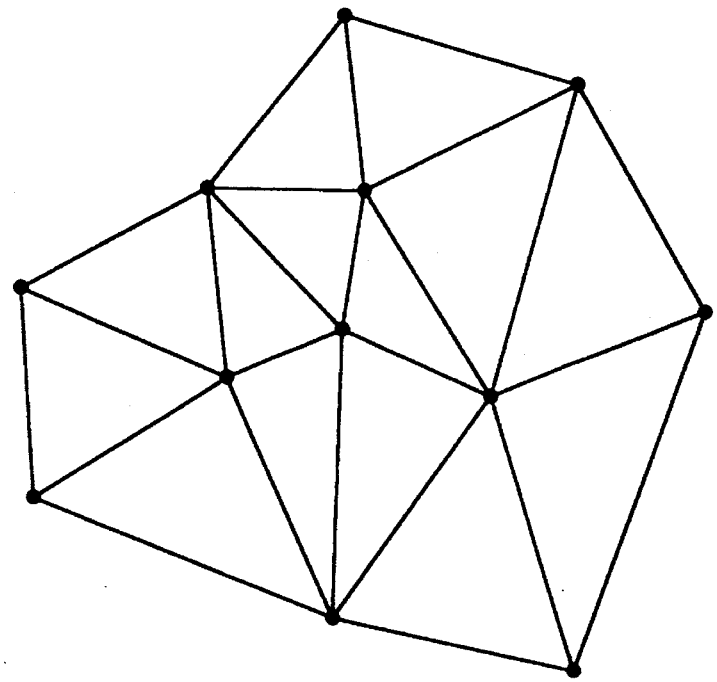
FIG. 20 is a diagram showing an example of execution of mesh node addition processing according to the recursive method.
Figure 21:
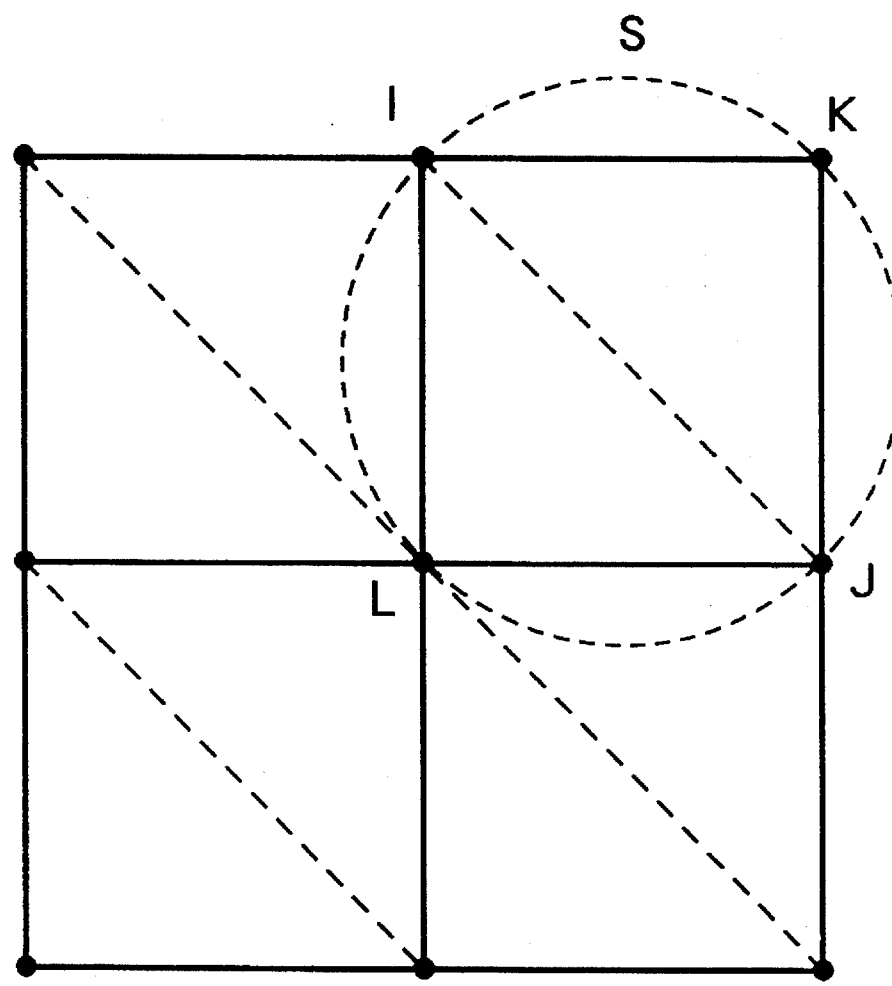
FIG. 21 is a diagram showing an example of execution of mesh division processing according to the Octree method.

For a terahedral mesh satisfying the conditions of the Delaunay partitioning shown in FIG. 12, when a mesh node A0 to be deleted is designated through the command input unit 20, the mesh generation processing control unit 58 controls the triangular element deletion unit 54 of the mesh node deletion processing unit 53 to delete the mesh node A0 and every mesh edge linked with the mesh node A0 (Step 1101). As a result, a polyhedron A1A2 . . . An is formed surrounding the deleted node A0 as illustrated in FIG. 13.

Next, the vertex selection unit 55 recognizes the formed polyhedron A1A2 . . . An (Step 202) to select a predetermined face (triangle) (Step 203). Then, out of vertexes other than the three vertexes Ai, Aj and Ak of the selected face, a vertex Al is found out that forms the terahedral element having the smallest circumsphere (Step 204).

The triangular element generation unit 16 joins the thus selected vertex Al to the triangle AiAjAk to generate a new terahedrai element AlAiAjAk (Step 205).

The foregoing processing for generating a new terahedral element in the polyhedron A1A2 . . . An is the three-dimensional execution of the same process as the processing for generating a triangular element in a polygon in the first embodiment. No other vertex is therefore contained in a circumsphere of a generated terahedral element, so that the terahedral element satisfies the conditions of the Delaunay partitioning.

The control unit 57 determines whether the processing of generating a new triangular element is completed for each of the sides of the polyhedron A1A2 . . . A6. Then, when the processing is not completed for all the sides, the routines goes back to Step 1103 to repeatedly execute the vertex selection processing by the vertex selection unit 55 and the new triangular element generation processing by the triangular element generation unit 56 (Step 1106). When a new triangular element is generated corresponding to every side of the polyhedron A1A2 . . . An, a predetermined mesh node is deleted to generate a new mesh satisfying the conditions of the Delaunay partitioning (Step 1107).

When in selecting a face and a vertex for the creation of a new terahedral element, an arbitrary face can be selected among those with respect to which processing is yet to be done. In this case, the shape of a generated mesh varies with the first selection of a face. In any case, however, since the conditions of the Delaunay partitioning is maintained during the process of the generation of each terahedral element, the Delaunay partitioning is ensured for a finally generated new mesh.

By using the thus arranged mesh generator 50, a density of the mesh can be changed following the procedure set forth below without increasing the total number of meshes.

First, in response to a command applied through the command input device 20, designated are an area where refinement of the mesh is necessary, the number of mesh nodes to be added, an area where the mesh is to be made coarser and the number of mesh nodes to be deleted. The commands for designating these areas are input by an analyzer after observing and determining a state of an initial mesh displayed on or printed out by the output device 30. More specifically, for an area in which analysis precision is to be improved by making meshes finer, a command for the mesh node adding processing is input by the mesh node addition processing unit 52. On the other hand, for an area of which determination is made that coarser meshes will not degrade analysis precision, a command for the mesh node deletion processing is input by the mesh node deletion processing unit 53. In a device analysis of a MOS transistor, for example, mesh nodes are added to the vicinity of a junction portion between a source and a drain, while they are deleted in a substrate region.

The mesh node addition processing 52 adds the designated number of mesh nodes to a designated area based on an applied command. Distribution of additional mesh nodes in a designated area can be designated by a command applied by an analyzer and each of the additional mesh nodes can be designated by using a nodeing device such as a mouse on a display screen of the output device 30. In addition, various ways of addition are possible such as allocation of mesh nodes according a distribution on coordinates determined by random numbers or an equal-interval distribution and allocation of mesh nodes to a circumcenter of a triangular element selected by random numbers.

The mesh node deletion processing unit 53 deletes the designated number of mesh nodes from a designated area based on an input command. A mesh node to be deleted can be designated by a command input by an analyzer or all mesh nodes to be deleted can be designated by using a nodeing device such as a mouse on the display screen of the output device 30. Various ways of deletion are possible, one of which is to determine a mesh node number to be deleted according to random numbers and the other is to set the number of nodes to be deleted for each of equally divided small areas and alternately determine a mesh node to be deleted in ascending or descending order of the mesh node number.

The density of meshes can be thus changed without increasing the number of mesh nodes.

As described in the foregoing, the present invention enables mesh nodes to be deleted to make a mesh coarse while maintaining the Delaunay partitioning. It is therefore possible to arbitrarily adjust a density of a mesh to make it coarser or finer according to the structure of a semiconductor device without increasing the number of mesh nodes in the entire area to be analyzed of the semiconductor device.

The invention accordingly has the advantage of refining a mesh in an area where a detailed simulation analysis is necessary to improve analysis precision and making a mesh coarser in an area where no detailed simulation analysis is necessary to prevent the volume of computation required for total analysis processing from exceeding a fixed upper limit, thereby avoiding an increase in the amount of a necessary memory and computation time.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A mesh generator comprising:

mesh generating means for setting on a semiconductor device to be analyzed a first two-dimensional triangular mesh satisfying conditions of a Delaunay partitioning;

mesh deleting means for deleting a predetermined mesh node and a mesh edge linking with the mesh node from the set mesh; and mesh re-generating means for setting, in a polygonal area formed by deleting said mesh node and said mesh edge, a new second triangular mesh which satisfies the conditions of the Delaunay partitioning and is coarser than said first triangular mesh, said mesh re-generating means comprising:

triangular element extracting means for extracting, out of triangles formed by an arbitrary side of said polygonal area generated by deleting the mesh node and the mesh edge and a vertex not included in the side, a triangle, whose circumcircle is the smallest, as a triangular element constituting said second triangular mesh;

said triangular element extracting means comprising:

vertex selecting means for selecting a vertex at which an angles is the largest with a side arbitrarily selected out of said polygonal area formed by deleting the mesh node and the mesh edge; and triangular element generating means for joining said selected side to a vertex to generate a triangular element.

2. The mesh generator according to claim 1, wherein said mesh re-generating means further comprises:

control means for repeatedly executing triangular element generation processing by said triangular element generating means until said triangular element is formed with respect to every side of said polygon.

3. The mesh generator according to claim 1, further comprising mesh re-generating means for adding a mesh node to a predetermined area of said semiconductor device on which a mesh is set, to set a new third triangular mesh containing the added mesh node and satisfying the conditions of the Delaunay partitioning.

4. A mesh generator comprising:

mesh generating means for setting on a semiconductor device to be analyzed a first three-dimensional tetrahedral mesh satisfying conditions of a Delaunay partitioning;

mesh deleting means for deleting a predetermined mesh node and a mesh edge linking with the mesh node from the set mesh; and mesh re-generating means for setting, in a polyhedral area formed by deleting said mesh node and said mesh edge, a new second terahedral mesh which satisfies the conditions of the Delaunay partitioning and is coarser than said first terahedral mesh, said mesh re-generating means comprising:

terahedral element extracting means for extracting, out of terahedrons formed by an arbitrary face of said polyhedral area generated by deleting the mesh node and the mesh edge and a vertex not included in the face, a terahedron whose circumsphere is the smallest as a terahedral element constituting said second new terahedral mesh;

said terahedral element extracting means comprising:

vertex selecting means for selecting a vertex that forms the terahedral element having the smallest circumsphere with a face of a polyhedron arbitrarily selected out of said polyhedral area formed by deleting the mesh node and the mesh edge; and tetrahedral element generating means for joining said selected face to a vertex to generate a terahedral element.

5. The mesh generator according to claim 4, wherein said mesh re-generating means further comprises:

control means for repeatedly executing terahedral element generation processing by said terahedral element generating means until said terahedral element is formed with respect to every face of said polyhedron.

6. The mesh generator according to claim 4, further comprising mesh re-generating means for adding a mesh node to a predetermined area of said semiconductor device on which a mesh is set, to set a new third terahedral mesh containing the added mesh node and satisfying the conditions of the Delaunay partitioning.

7. A mesh generating method comprising steps of:

setting on a semiconductor device to be analyzed a first two-dimensional triangular mesh satisfying conditions of a Delaunay partitioning;

deleting a predetermined mesh node and a mesh edge linking with the mesh node from the set mesh; and setting a new second triangplar mesh, which satisfies the conditions of the Delaunay partitioning and is coarser than said first triangular mesh, in a polygonal area formed by deleting said mesh node and said mesh edge without adding a new mesh node, said step of setting a new second triangular mesh comprising a step of:

extracting, out of triangles formed by an arbitrary side of said polygonal area generated by deleting the mesh node and the mesh edge and a vertex not included in the side, triangle whose circumcircle is the smallest as a triangular element constituting said new second triangular mesh;

said step of extracting a triangular element comprising steps of:

selecting a vertex at which an angle is the largest with a side arbitrarily selected out of a polygon formed in said area where the mesh node and the mesh edge are deleted; and joining said selected side to a vertex to generate a triangular element.

8. The mesh generating method according to claim 7, wherein said step of setting a new second triangular mesh comprises a step of:

repeatedly executing triangular element generation processing until said triangular element is formed with respect to every side of said polygon.

9. The mesh generating method according to claim 7, further comprising the step of:

adding a mesh node to a predetermined area of said semiconductor device on which a mesh is set, to set a new third triangular mesh containing the added mesh node and satisfying the conditions of the Delaunay partitioning.

10. A mesh generating method comprising steps of:

setting on a semiconductor device to be analyzed a first three-dimensional terahedral mesh satisfying conditions of a Delaunay partitioning;

deleting a predetermined mesh node and a mesh edge linking with the mesh node from the set mesh; and setting a new second terahedral mesh, which satisfies the conditions of the Delaunay partitioning and is coarser than said first terahedral mesh, in a polyhedral area formed by deleting said mesh node and said mesh edge without adding a new mesh node, said step of setting a new second terahedral mesh comprising a step of:

extracting, out of terahedrons formed by an arbitrary face of said polyhedron formed in the area where the mesh node and the mesh edge are deleted and a vertex not included in the face, a terahedron whose circumsphere is the smallest as a terahedral element constituting said new second terahedral mesh;

said step of extracting a terahedral element comprising steps of:

selecting a vertex that forms the terahedral element having a smallest circumsphere with a face of a polyhedron arbitrarily selected out of said polyhedral area formed by deleting the mesh node and the mesh edge; and joining said selected face to a vertex to generate a triangular element.

11. The mesh generating method according to claim 10, wherein said step of setting a new second terahedral mesh comprises a step of:

repeatedly executing terahedral element generation processing until said terahedral element is formed with respect to every face of said polyhedron.

12. The mesh generating method according to claim 10, further comprising the step of:

adding a mesh node to a predetermined area of said semiconductor device on which a mesh is set, to set a new third terahedral mesh containing the added mesh node and satisfying the conditions of the Delaunay partitioning.

* * * * *